United States Patent [19]

Clemons et al.

[11] 4,274,013

[45] Jun. 16, 1981

[54] SENSE AMPLIFIER

[75] Inventors: Donald G. Clemons, Walnutport; William R. Huber, III, Center Valley, both of Pa.

[73] Assignee: Bell Telephone Laboratories, Incorporated, Murray Hill, N.J.

[21] Appl. No.: 10,740

[22] Filed: Feb. 9, 1979

[51] Int. Cl.³ .............................................. G11C 7/00
[52] U.S. Cl. .................................... 307/530; 307/279; 307/DIG. 3; 365/190; 365/202; 365/205
[58] Field of Search ............... 307/279, 291, 355, 356, 307/362, 238, DIG. 3; 365/190, 196, 202, 203, 205, 207, 208, 220–222

[56] References Cited

U.S. PATENT DOCUMENTS

| | | | |
|---|---|---|---|
| 3,838,295 | 9/1974 | Lindell | 307/DIG. 3 X |
| 4,007,381 | 2/1977 | Mohsen | 307/362 X |
| 4,021,682 | 5/1977 | Elmer et al. | 307/DIG. 3 X |
| 4,050,061 | 9/1977 | Kitagawa | 307/DIG. 3 X |
| 4,053,873 | 10/1977 | Freeman et al. | 307/DIG. 3 X |
| 4,061,999 | 12/1977 | Proebsting et al. | 365/203 X |
| 4,069,474 | 1/1978 | Boettcher et al. | 365/205 |
| 4,070,590 | 1/1978 | Ieda et al. | 307/355 |
| 4,085,457 | 4/1978 | Itoh | 365/205 |
| 4,119,871 | 10/1978 | Zibert | 307/DIG. 3 X |
| 4,158,241 | 6/1979 | Takemae | 307/DIG. 3 X |
| 4,162,416 | 7/1979 | Beecham et al. | 307/362 |

FOREIGN PATENT DOCUMENTS 2441214 3/1976 Fed. Rep. of Germany .......... 365/205
2712735 9/1978 Fed. Rep. of Germany .......... 365/205

OTHER PUBLICATIONS

Arzubi, "WRITE/SENSE Scheme for Monolithic Memories", IBM Tech. Discl. Bull., vol. 18, No. 8, pp. 2450-2451, Jan. 1976.
Heller et al., "High Sensitivity Charge-Transfer Sense Amplifier", IEEE-JSSC, vol. SC-11, No. 5, pp. 596-601, Oct. 1976.
Hoffmann et al., "VMOS Technology Applied to Dynamic RAM's", IEEE-JSSC, vol. SC-13, No. 5, pp. 618-622, Oct. 1978.
Meusburger et al., "An 8 mm², 5V 16K Dynamic RAM Using a New Memory Cell", IEEE-JSSC, vol. SC-13, No. 5, pp. 708-711, Oct. 1978.

*Primary Examiner*—Larry N. Anagnos
*Attorney, Agent, or Firm*—Irwin Ostroff

[57] ABSTRACT

An improved field effect transistor sense amplifier uses a cross-coupled pair of first transistors (Q1, Q2) with separate third and fourth transistors (Q3, Q4) connected by the sources (12, 14) to each of one of cross-coupled terminals (12, 14) of the cross-coupled pair (Q1, Q2). Read circuitry (Q7, Q8) is connected directly to the cross-coupled terminals (12, 14) of the cross-coupled pair (Q1, Q2). Write circuitry (Q9, Q10) is connected to the drains (18, 22) of the third and fourth transistors (Q3, Q4).

9 Claims, 2 Drawing Figures

4,274,013

SENSE AMPLIFIER

BACKGROUND OF THE INVENTION

This invention relates to memory circuitry and, in particular, to improved latching-type sense amplifiers suitable for use with random access memory (RAM) systems.

Latching-type sense amplifiers have been used in dynamic semiconductor memories such as are described in articles entitled "VMOS Technology Applied to Dynamic RAM's" by Kurt Hoffmann and Reinhard Losehand (FIG. 2), and "An 8 mm$^2$, 5 V 16K Dynamic RAM Using a New Memory Cell" by Gunther Meusburger, Karlheinrich Horninger, and Gerold Lindert (FIG. 2(a)), which appear in the *IEEE Journal of Solid-State Circuits*, Volume SC-13, No. 5, October 1978, at pages 617–622 and 708–711, respectively. These sense amplifiers consist essentially of first and second cross-coupled transistors and of third and fourth transistors whose drain-source output circuitry couples the cross-coupled pair of transistors to bit lines of the memory. The third and fourth transistors act as buffers between the bit lines, which have relatively heavy capacitance associated therewith, and the cross-coupled pair of transistors. Read/write circuits, which are also denoted as input/output (I/O) circuits, are connected directly to the bit lines or directly to the cross-coupled pair. The third and fourth transistors are either biased so as to make them continuously on during all cycles of the memory or are biased on during only selected portions of the memory cycle. The sense amplifiers described hereinabove tend to provide either slower memory access or cycle time than is desirable and/or incur high current spikes that can cause a loss in memory operating margins.

It would be desirable to have a sense amplifier that facilitates relatively fast semiconductor memory access and cycle times and which reduces the magnitude of current spikes.

SUMMARY OF THE INVENTION

A solution to the above-described problems is achieved with circuitry comprising a cross-coupled circuit (Q1, Q2) having first (12) and second (14) terminals, read/write circuits (Q7, Q8, Q9, Q10), and first (Q3) and second (Q4) switching-type devices which each have a control terminal and first and second output terminals. The first terminal (12) of the cross-coupled circuit (Q1, Q2) is connected to the first output terminal of the first switching-type device (Q3). The second terminal (14) of the cross-coupled circuit is connected to the first output terminal of the second switching-type device (Q4). The circuitry is characterized in that the read/write circuits (Q7, Q8, Q9, Q10) comprise separate first (Q7) and second (Q8) read circuits and separate first (Q9) and second (Q10) write circuits. The circuitry is further characterized in that the first (Q7) and second (Q8) read circuits are connected to the first (12) and second (14) terminals, respectively, of the cross-coupled circuit (Q1, Q2) and in that the first (Q9) and second (Q10) write circuits are connected to the second output terminal (18) of the first device (Q3) and to the second output terminal (22) of the second device (Q4), respectively.

In one illustrative embodiment of the present circuitry the cross-coupled circuit comprises two n-channel field effect transistors with the gate of each connected to the drain of the other and to one of the first and second terminals of the cross-coupled circuit. The first and second switching-type devices, which may be denoted as buffer devices or transistors, are also n-channel field effect transistors. Each of the read and write circuits comprises a separate n-channel field effect transistor. The drain of the first read transistor is connected to the first terminal of the cross-coupled circuit and the drain of the second read transistor is connected to the second terminal of the cross-coupled circuit. The source of the first write transistor is connected to the drain of the first transistor and the source of the second write transistor is coupled to the drain of the second transistor. It is to be noted that the direction of current flow through a field effect transistor determines which output terminal is denoted as the source or the drain. As the current flow reverses, this designation also reverses.

In one typical application separate bit lines of a memory system are connected directly to the drains of the first and second buffer transistors of the above-described circuitry. Each bit line has at least one memory cell and/or a reference memory cell connected thereto. The first and second buffer transistors are biased so as to be in the conductive state. They are designed to have relatively high impedance such that the capacitance associated with each bit line is buffered from the first and second terminals of the cross-coupled circuitry. The direct connection of the read circuits to the first and second terminals of the cross-coupled circuit facilitates a relatively rapid read operation because readout can occur essentially as soon as the cross-coupled circuit has latched to the proper state. Thus the readout operation need not wait until the potentials of the bit lines change as they will after an appropriate delay which is a function of the resistance of the first and second transistors and the capacitance associated with the respective bit lines. The direct connection of the write circuits to the same terminals as are connected to the bit lines facilitates a rapid write operation. The use of relatively high impedance first and second transistors, as well as maintaining same in the conductive state at all times, tends to decrease the magnitude of current spikes. This tends to increase operating noise margins of the memory system.

These and other features of the invention will be better understood from a consideration of the following detailed description taken in conjunction with the following drawing.

DETAILED DESCRIPTION

Figure 1:
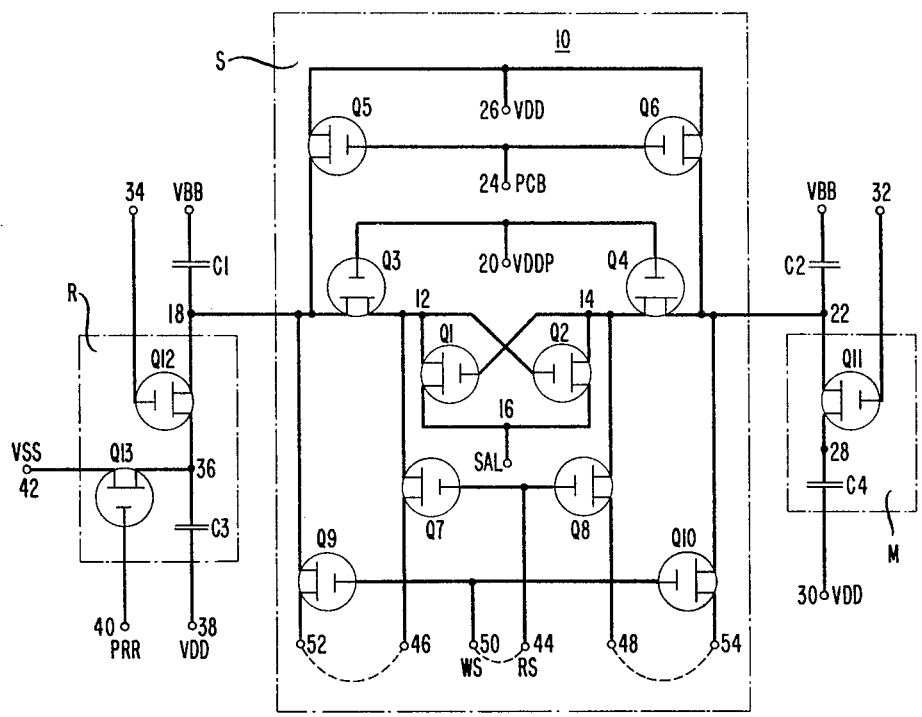
FIG. 1 illustrates a sense amplifier in accordance with an embodiment of the invention.

Referring now to FIG. 1, there is illustrated within dashed line rectangle S a sense amplifier 10 which comprises field effect transistors Q1, Q2, Q3, Q4, Q5, Q6, Q7, Q8, Q9, and Q10. Connected to one side of sense amplifier 10 at a first outer terminal 22 is a switched capacitor memory cell (illustrated within dashed line rectangle M) which comprises a field effect transistor Q11 and a capacitor C4. Connected to the other side at a second outer terminal 18 is a reference memory cell (illustrated within dashed line rectangle R) which comprises field effect transistors Q12 and Q13 and capacitor C3. Memory cell M is connected by the source of Q11 to terminal 22 which has a capacitor C2 connected thereto. Reference memory cell R is connected by the source of Q12 to terminal 18 which has a capacitor C1 connected thereto. C1 and C2 represent the parasitic capacitances of all devices and lines connected to these terminals. C1 and C2 are illustrated connected to a potential VBB which represents the potential of a semiconductor body (substrate) in which sense amplifier 10 and memory cell M and reference memory cell R are fabricated.

Sense amplifier 10 senses the logic information stored in memory cell M, provides refresh, and facilitates a rapid reading out and writing in of information while avoiding large current peaks.

Figure 2:
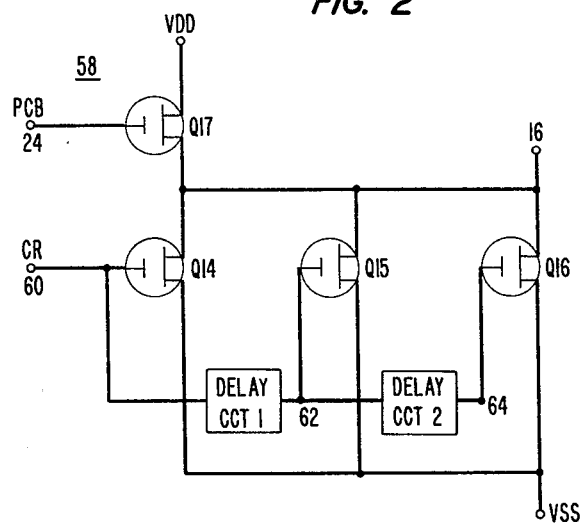
FIG. 2 illustrates circuitry which can be used in conjunction with the sense amplifier of FIG. 1.

The gate of Q2 is connected to the drain of Q1, the source of Q3, the drain of Q7, and to a first inner terminal 12. The gate of Q1 is connected to the drain of Q2, the source of Q4, the drain of Q8, and to a second inner terminal 14. The combination of Q1 and Q2 is denoted as a cross-coupled pair, a cross-coupled circuit, or a flip-flop. The sources of Q1 and Q2 are connected together to a terminal 16 and to a voltage pulse generator denoted as SAL. One embodiment of SAL is illustrated in FIG. 2 as circuit 58. Q7 and Q8 facilitate the rapid readout of information appearing on inner or readout terminals 12 and 14, respectively. They may be denoted as read circuits or read circuitry. The gates of Q7 and Q8 are connected together to a terminal 44 and to a voltage pulse generator RS. The sources of Q7 and Q8 are connected to terminals 46 and 48, respectively. Terminals 46 and 48 serve as complementary read output terminals.

The drain of Q3 is connected to terminal 18, the source of Q9, and to the source of Q5. The drain of Q4 is connected to terminal 22, the source of Q6, and to the source of Q10. Q9 and Q10 facilitate the rapid writing in of information (data) into memory cells connected to the outer or write-in terminals 18 and 22, respectively. They may be denoted as write circuits or write circuitry. The gates of Q9 and Q10 are coupled together to a terminal 50 and to a voltage pulse generator WS. The drains of Q9 and Q10 are connected to terminals 52 and 54, respectively. Terminals 52 and 54 serve as complementary data input (write) terminals. The coupling together of terminals 44 and 50 by a dashed line indicates that these terminals can be connected together. Likewise, the dashed lines connecting terminals 46 and 52 and terminals 48 and 54 indicate that these terminals can be connected together as illustrated.

The drains of Q5 and Q6 are connected together to a terminal 26 and to a power supply VDD. The gates of Q5 and Q6 are connected together to a terminal 24 and to a voltage pulse source PCB. Q5 and Q6 serve as precharge circuitry which is used to selectively set the potentials of terminals 18 and 12 and 22 and 14, respectively, to essentially equal voltages. Q3 and Q4 may be denoted as buffer transistors. The gates of Q3 and Q4 are connected together to a terminal 20 and to a potential source VDDP.

An MOS transistor will be described as enabled if the potential of the gate with respect to the source is of sufficient amplitude and polarity to allow conduction between the source and drain thereof. Conversely, a disabled MOS transistor is one in which the potential of the gate is insufficient or of the wrong polarity to allow conduction between the source and drain thereof.

The memory cell illustrated within dashed line rectangle M and its mode of operation are well known. The drain of Q11 is connected to one terminal of C4 and to a terminal 28. The second terminal of C4 is connected to a terminal 30 and to potential VDD. The gate of Q11 is connected to a terminal 32. A "1" stored in the memory cell results in terminal 28 being charged to a potential of approximately VDD minus the threshold voltage (Vth) of Q11. Typical values for VDD and Vth are +8 volts and approximately 1 volt, respectively. A "0" stored in the memory cell results in the potential of terminal 28 being charged to a level of approximately VSS. A typical value for VSS is zero volts. A "1" is written into memory cell M by enabling Q11 (by applying the VDD potential to terminal 32) and by applying a potential of VDD minus one threshold voltage, or a more positive voltage, to the source of Q11 (terminal 22). This sets the potential of terminal 28 to VDD-Vth, a stored "1." A "0" is written into the memory cell by enabling Q11 and setting the potential of terminal 22 to VSS. This causes terminal 28 to be set to VSS, a stored "0."

The readout of logic information stored in memory cell M is accomplished by enabling Q11 and allowing the potential previously stored on terminal 28 to modify the potential of terminal 22. Gate terminal 32 is typically coupled to a word line of a semiconductor memory and terminal 22 is coupled to a bit line of the same memory.

In reference memory cell R the drain of Q13 is connected to one terminal of capacitor C3, to the drain of Q12, and to a terminal 36. A second terminal of C3 is connected to a terminal 38 and to VDD. The gate of Q12 is connected to a terminal 34. The source of Q13 is connected to a terminal 42 and to a power supply VSS. The gate of Q13 is connected to a terminal 40 and a voltage pulse source PRR. C3 is selected to have approximately one-half of the capacitance of C4. The ratio of C3 to C4 affects the relative potential levels of terminals 18 and 22.

Sense amplifier 10 operates essentially as follows: PCB is initially held at a high potential level that is at least a threshold voltage above the potential of power supply VDD. VDDP is also at a potential level which is at least one threshold voltage above the potential of power supply VDD. SAL is at a potential level of VDD and terminals 32, 34, 44, and 50 are all set in potential to VSS. Circuitry 58, which can be used to provide the output waveform of SAL, is illustrated in FIG. 2. PRR is at a potential level of approximately VDD minus one threshold voltage. These conditions enable Q3, Q4, Q5, Q6, and Q13 and disable Q1, Q2, Q7, Q8, Q9, Q10, Q11, and Q12. This causes terminals 18 and 22, as well as 12 and 14, to be set and held at a potential level of VDD. In addition, terminal 36 is set to a potential level of VSS.

Shortly after the beginning of a cycle of operation, PCB and PRR are both lowered in potential to VSS. This causes terminals 12, 14, 18, 22, and 36 to electrically float in potential at the previously set levels. After this occurs, terminals 32 and 34 are increased in potential from VSS to VDD. This enables Q11 and Q12 and thus couples terminal 36 to terminal 18 through Q12 and couples terminal 28 to terminal 22 through Q11. This causes the potentials of terminals 18 and 22 to be modified as a function of the potentials of terminals 36 and 28, respectively, and as a function of the relative capacitances of C3 and C1 and of C4 and C2, respectively. There are parasitic capacitances associated with terminals 12 and 14, but these capacitances (which are not illustrated) are considerably less than those of C1 and C2. There is also a parasitic capacitance (not illustrated) associated with terminal 16.

If a "0" is stored in memory cell M, then terminal 28 is initially at VSS (typically zero volts). The enabling of Q11 causes terminal 22 to discharge from the initially set potential level of VDD by an amount $\Delta V$ such that it reaches a potential of VDD-$\Delta V$. The simultaneous enabling of Q12 causes terminal 18 to discharge in potential to a value of VDD-0.5$\Delta V$. These potentials are achieved because the ratio of C3 to C4 is approximately one to two.

Q3 and Q4 are always enabled and, accordingly, the potential changes at terminals 18 and 22 propagate through Q3 and Q4, respectively, and change the potentials at terminals 12 and 14 such that the potentials of these terminals correspond to the potential of terminals 18 and 22, respectively.

At this point in time terminal 16 is pulsed from the initial potential level of VDD towards potential of VSS. The slope of the edge of the voltage pulse is initially gradual and then increases rapidly. The potential of the gate of Q2 is more positive than the gate of Q1. Accordingly, as terminal 16 drops in potential, Q1 remains disabled and Q2 becomes enabled and begins to conduct and thus discharges terminal 14. The potential difference between terminals 12 and 14 thus increases. Terminal 12 stays essentially at the potential level of VDD-0.5$\Delta V$ at this time. As soon as the potential difference between terminals 12 and 14 has increased to typically the magnitude of a threshold voltage (1 volt in a typical case), the slope of the voltage waveform applied to terminal 16 (SAL) rapidly increases such that the potentials of terminals 14 and 16 then thereafter rapidly move towards VSS. Terminal 12 stays near the potential of VDD-0.5$\Delta V$ during the entire time terminal 16 is pulsed from VDD to VSS.

As terminal 16 reaches VSS in potential, terminal 44 (RS) is pulsed in potential from VSS to VDD. Typically terminals 46 and 48 are electrically set in potential to VDD by voltage precharge circuitry (not illustrated) and then allowed to float in potential just prior to the time at which terminal 44 is brought from VSS to VDD. In the case of a stored "0" in memory cell M, Q8 becomes enabled and thus the potential of terminal 14 is transferred to terminal 48. Thus terminal 48 is lowered in potential towards VSS. This represents the readout of a "0" from memory cell M. Q7 remains disabled since the gate, drain, and source thereof are all at or near potential VDD. Thus terminal 46 remains at VDD while terminal 48 drops to a potential level below VDD. Thus the differential voltage between terminals 12 and 14 has been transferred to terminals 46 and 48.

In a typical memory system terminals 46 and 48 will be connected to another sense amplifier (not illustrated) which is especially suited to driving relatively high capacitive loads. One amplifier which is well adapted to meet this need is disclosed in copending U.S. application Ser. No. 869,844, filed Jan. 16, 1978 (D. Beecham-H. C. Kirsch), in which there is a common assignee.

As readout is occurring, memory cell M begins to be refreshed. Terminal 14 discharges rapidly to VSS. Terminal 22 discharges much more slowly because of the resistance of Q4 and the capacitance of C2. Q3 and Q4 are designed in known fashion to have relatively high resistance between drain and source when enabled. Thus the current spike which results from the discharge of C2 has a lower peak magnitude and a longer time duration than would be the case if Q4 had relatively low resistance. It is to be noted that the readout operation can start as soon as the cross-coupled pair is latched up by the negative going voltage pulse applied to terminal 16. There is no need to wait until terminal 22 reaches the same potential as terminal 14. Thus the readout of information from sense amplifier 10 to terminals 46 and 48 can proceed without waiting for refresh to be completed.

As terminal 22 drops to the VSS potential level, terminal 28 likewise drops in potential because Q11 is still enabled. Thus memory cell M has been refreshed such that it now again stores a logic "0." At this point in time terminal 18 is still close in potential to VDD and terminal 36 is charged to a potential of approximately VDD minus the threshold voltage of Q12 because Q12 is enabled at this time.

Now the cycle of operation of sense amlifier 10 can be ended and terminals 32, 34, and 44 are returned to VSS and terminals 16, 24, and 40 are returned to their initial positive potentials. In addition, terminals 46 and 48 are again set in potential to +VDD. This enables Q13 and causes terminal 36 to discharge to VSS. All other previously discussed terminals are set to the initial potential levels discussed earlier.

If memory cell M contains a stored "1" instead of a "0," then during the time when Q11 is initially enabled, terminal 14 remains at the initially set value of VDD. The potential of terminal 12 still drops from VDD to a potential of VDD-0.5$\Delta V$. These conditions result in terminal 12 being discharged to VSS when terminal 16 is pulsed to VSS, terminal 48 remaining at +VDD, and terminal 46 dropping towards VSS as terminal 44 (RS) is pulsed to +VDD. This is indicative of the readout of a stored "1" from the memory cell. Memory cell M is refreshed to a full "1" potential level of VDD-Vth as soon as Q11 becomes enabled. Terminal 28 of memory cell M stays at a potential of VDD minus the threshold voltage of Q11 during this cycle of operation. This represents a stored "1" in memory cell M. As terminal 16 is pulled to VSS, terminal 12 is pulled down to VSS because it is at a lower potential than terminal 14. Terminal 18 is likewise pulled down in potential to VSS. Accordingly, terminal 36 is also pulled down in potential to VSS since Q12 is enabled.

Logic signal information (data) can be written into the memory cell through Q10. It is to be noted that the memory cell M can be connected to terminal 18 and the reference memory cell R can be connected to terminal 22. In such case data is written into the memory cell through Q9. During a write cycle of operation the same procedures are used as during a read operation except that terminal 50 (WS) is pulsed in potential from VSS to VDD and terminal 44 is held in potential at VSS. The data to be written into the memory cell M is applied to terminal 54 and the complement thereof is applied to terminal 52. This causes terminals 22 and 18 to be forced to essentially the potentials of terminal 54 and 52, respectively. Thus the desired logic information is transferred into memory cell M since Q11 is enabled at this time.

A read-modified write operation is also possible. After the normal read operation is over, Q7 and Q8 are disabled and Q9 and Q10 are enabled. This allows new information (data) applied to terminal 54 to be written into memory cell M after the previously stored information has been read out.

Memory cell M can be refreshed during a read, a write, or a read-modified write operation. In addition, it can be refreshed even if none of the above operations are carried out. If it is desired only to refresh the information stored in memory cell M, then terminals 44 and 50 are held at VSS during the entire cycle of operation of sense amplifier 10. A memory cell containing a "1," which may or may not have discharged from the full "1" potential level of VDD-Vth, is recharged to or maintained at the full "1" potential level as Q11 becomes enabled. A memory cell containing a "0" is initially charged up to a potential between zero volts and VDD-Vth. The pulsing of terminal 16 thereafter to VSS causes terminal 22 to discharge to VSS and thereby discharges the memory cell such that it again stores a "0."

The number of read and write terminals for sense amplifier 10 can be consolidated from six terminals to three terminals by connecting terminals 46 and 52 together, by connecting terminals 48 and 54 together, and by connecting terminals 44 and 50 together. Even when so configured, the paths including Q7 and Q8 are the primary read paths since they will handle essentially all of the read currents, while for writing Q9 and Q10 provide the primary write paths since they will handle essentially all the write current.

Now referring to FIG. 2, there is illustrated circuitry 58 which can be used as the voltage generator circuit SAL of FIG. 1. Circuitry 58 comprises field effect transistors Q14, Q15, Q16, and Q17 and delay circuits 1 and 2. The output voltage waveform at terminal 16 is designed to be initially at +VDD and then to drop to +VDD-Vth. It then is designed to drop in potential with a gradual slope towards VSS. After a preselected time it is designed to drop in potential at a much more rapid rate and to then reach VSS in potential.

The drains of Q14, Q15, and Q16 and the source of Q17 are all connected to terminal 16. The sources of Q14, Q15, and Q16 are all connected together to power supply VSS. The drain of Q17 is connected to power supply +VDD. The gate of Q14 is connected to an input terminal 60, to a voltage pulse generator CR, and to an input of delay circuit 1. An output terminal of delay circuit 1 is connected to the gate of Q15, an input terminal of delay circuit 2, and to a terminal 62. An output terminal of delay circuit 2 is connected to the gate of Q16, and to a terminal 64. The gate of Q17 is connected to terminal 24 (PCB).

At the beginning of a cycle of operation terminal 24 (PCB) is at a potential at least as positive as +VDD plus a threshold voltage and terminal 60 (CR) is at VSS. This enables Q17 and disables Q14, Q15, and Q16. This causes terminal 16 to be held at +VDD. Terminal 24 (PCB) is then pulsed to VSS and terminal 16 remains floating in potential at +VDD. Terminal 60 (CR) is then pulsed in potential from VSS to +VDD. Concurrently terminals 32 and 34 (of FIG. 1) are pulsed from VSS to +VDD. This enables Q14 and thus pulls terminal 16 down towards +VSS. The initial rate of fall of the potential of terminal 16 is determined by the impedance of Q14 and the capacitance (not illustrated) on terminal 16 to cause terminal 16 to reach a potential of approximately VDD-Vth at the time terminals 12 and 14 have had their potentials modified as a function of the potential levels stored in the reference memory cell R and memory cell M. This leaves Q1 and Q2 just on the verge of being enabled. The time period of delay of delay circuit 1 is chosen to allow sufficient time for the information stored in memory cell M and in reference cell R to be transferred to terminals 14 and 12, respectively.

After the delay time introduced by delay circuit 1, the gate of Q15 becomes enabled and starts to pull terminal 16 further towards VSS. The impedance of Q15 is designed to be significantly lower than that of Q14 and somewhat higher than that of Q1 and Q2 or the parallel combination of Q1 and Q2 such that terminal 16 is gradually pulled further down in potential towards VSS as Q15 is enabled. The impedance of Q15 is also selected to limit the rate of all of the potential of terminal 16 so as to allow terminal 12 or 14, whichever is the least positive potential at the time, to closely follow terminal 16 down in potential. This amplifies the differential voltage between terminals 14 and 12 while insuring that the more positive of the two terminals remains at the potential level previously established and essentially does not discharge from that potential level. The delay time associated with delay circuit 2 allows for the differential voltage between terminals 14 and 12 to reach a potential of somewhat greater than a threshold voltage before Q16 becomes enabled. Q16 is of relatively low impedance and is therefore capable of pulling terminal 16 to VSS relatively quickly.

Sense amplifier 10 has been fabricated as part of a 64K (65,536 bits) Random Access Memory that utilizes n-channel insulated gate field effect transistors and memory cells and reference memory cells of a type described herein. Q3 and Q4 each had resistance between drain and source of approximately 50,000 ohms. It has been tested and found to be functional. The memory cells are divided into four 16K arrays. Each 16K array has 256 bit lines associated therewith. A group of 256 sense amplifiers, each of the type disclosed in FIG. 1, is connected to the bit lines in each pair of 16K arrays. A separate SAL voltage generator circuit is connected to each group of 256 sense amplifiers. The impedances of Q14, Q15, and Q16 of the SAL generator circuits are designed to reflect that the impedances of 256 cross-coupled pairs of transistors Q1 and Q2 are being used and not just one cross-coupled pair. The SAL-type voltage generators fabricated have the basic structure illustrated in FIG. 2; however, they have been adapted to allow the complete latching of one of the two groups of sense amplifiers before the other. This serves to limit the number of current spikes occurring simultaneously and to spread current dissipation of the memory more evenly over an entire cycle of operation. A concurrently filed patent application Ser. No. 10,839 (R. P. Cenker-D. G. Clemons-W. R. Huber III-F. J. Procyk), in which there are some common inventors and a common assignee, discloses the sense amplifier of the present invention and, in addition, discloses the actual SAL-type circuitry which forms part of the memory that has been fabricated.

It is to be understood that the embodiments described are merely illustrative of the general principles of the invention. Various modifications are possible within the scope of the invention. For example, p-channel field effect transistors could be substituted for the n-channel field effect transistors provided the polarities of the power supply potentials and voltage pulses are appropriately changed. Still further, a variety of different types of resistors or depletion type field effect transistors could be substituted for transistors Q3 and Q4. Still further the cross-coupled circuitry can be more complex than just two transistors. Another transistor could be added to the illustrated precharge circuitry with the gate of the added transistor connected to the gates of Q5 and Q6 and the drain and source thereof connected to the source of Q5 and the source of Q6, respectively, or to the drains of Q1 and Q2. The sources of Q5 and Q6 could be connected to terminals 12 and 14, respectively, instead of to terminals 18 and 22, respectively. Still further, voltage pulse generator circuit 58 (SAL) could easily be modified or replaced with circuitry which provides the same voltage characteristics. Still further the read and write circuitry can be more complex than just a single transistor for each circuit. Still further, gate terminals 20 of transistors Q3 and Q4 need not be enabled at all times. They can be connected to a voltage pulse generator and appropriately enabled and disabled during a cycle of operation. Still further, gate terminals 20 of Q3 and Q4 could be connected to a voltage pulse generator and appropriate potential levels could be generated to cause Q3 and Q4 to be of lower resistance during the time the information stored in the memory cell M and the reference memory cell R is transferred to terminals 14 and 12, respectively, than at all other times during a cycle of operation.

We claim:

1. Circuitry comprising cross-coupled circuitry (Q1, Q2) having first (12) and second (14) inner terminals and first (18) and second (22) outer terminals and separate buffer means (Q3, Q4) serially connected between the first inner and outer terminals (12, 18) and between the second inner and outer terminals (14, 22), and read circuitry (Q7, Q8) and write circuitry (Q9, Q10), and characterized in that:

the read circuitry (Q7, Q8) is connected to the pair of inner terminals (14, 12) and the write circuitry (Q9, Q10) is connected to the pair of outer terminals (18, 22).

2. Circuitry comprising a cross-coupled circuit (Q1, Q2) having first (12) and second (14) terminals and first (Q3) and second (Q4) switching-type devices which each have a control terminal (20) and a first (12, 14) and a second (18, 22) output terminal, the first output terminals of the first (Q3) and second (Q4) devices are connected to the first (12) and second (14) terminals, respectively, of the cross-coupled circuit (Q1, Q2), and read and write circuits (Q7, Q8, Q9, Q10), and being characterized in that:

the read and write circuits (Q7, Q8, Q9, Q10) comprise separate first (Q7) and second (Q8) read circuits and separate first (Q9) and second (Q10) write circuits;

the first (Q7) and second (Q8) read circuits are connected to the first (12) and second (14) terminals of the cross-coupled circuit, respectively, and the first write circuit (Q9) is connected to the second terminal (18) of the first device (Q3), and the second write circuit (Q10) is connected to the second terminal (22) of the second device (Q4).

3. The circuitry of claim 2 further characterized in that:

the cross-coupled circuit (Q1, Q2) comprises third (Q1) and fourth (Q2) switching devices which each have a control terminal and first and second output terminals;

the control terminal of the fourth switching device (Q2) is connected to the first output terminal of the third switching device (Q1) and to the first terminal (12) of the cross-coupled circuit (Q1, Q2); and the control terminal of the third switching device (Q2) is connected to the first output terminal of the fourth switching device (Q2) and to the second terminal (14) of the cross-coupled circuit (Q1, Q2).

4. The circuitry of claim 3 further characterized in that:

the first read circuit (Q7) comprises a fifth switching device (Q7) and the second read circuit (Q8) comprises a sixth switching device (Q8);

the first write circuit (Q9) comprises a seventh switching device (Q9) and the second write circuit (Q10) comprises an eighth switching device (Q10);

each of the fifth (Q7), sixth (Q8), seventh (Q9), and eighth (Q10) switching devices has a control terminal and first and second output terminals;

the first output terminal of the fifth switching device (Q7) is connected to the first terminal (12) of the cross-coupled circuit (Q1, Q2), and the first output terminal of the sixth switching device (Q8) is connected to the second terminal (14) of the cross-coupled circuit (Q1, Q2); and the first output terminal of the seventh switching device (Q9) is connected to the second output terminal (18) of the first switching device (Q3), and the first output terminal of the eighth switching device (Q10) is connected to the second terminal (22) of the second switching device (Q4).

5. The circuitry of claim 4 further characterized by precharge circuitry (Q5, Q6) connected to the second output terminals (18, 22) of the first (Q3) and second (Q4) switching devices.

6. The circuitry of claim 5 further characterized in that:

precharge circuitry (Q5, Q6) comprises ninth (Q5) and tenth (Q6) switching devices which each have a control terminal and first and second output terminals;

the control terminals of the ninth (Q5) and tenth (Q6) switching devices are connected together;

the second output terminal of the ninth switching device (Q5) is connected to the second output terminal (18) of the first switching device (Q3); and the second output terminal of the tenth switching device (Q6) is connected to the second output terminal (22) of the second switching device (Q4).

7. The circuitry of claim 6 further characterized in that:

the second output terminals (16) of the third (Q1) and fourth (Q2) switching devices are connected together;

voltage pulse generator circuitry (Q14, Q15, Q16, and Q17 and delay circuits 1 and 2) which comprises eleventh (Q14), twelfth (Q15), thirteenth (Q16), and fourteenth (Q17) switching devices which each have a control terminal and first and second output terminals and which further comprises first (1) and second (2) delay circuits;

the first (Q3), second (Q4), third (Q1), fourth (Q2), fifth (Q7), sixth (Q8), seventh (Q9), eighth (Q10), ninth (Q5), tenth (Q6), eleventh (Q14), twelfth (Q15), thirteenth (Q16), and fourteenth (Q17) switching devices all are field effect transistors;

the sources of the eleventh (Q14), twelfth (Q15), and thirteenth (Q16) transistors are connected together;

the drains of the eleventh (Q14), twelfth (Q15), and thirteenth (Q16) transistors and the source of the fourteenth (Q17) transistor are connected to the sources (16) of the third (Q1) and fourth (Q2) transistors;

the gate of the eleventh (Q14) transistor is connected to an input terminal (60) and is connected to a first input terminal of the first delay circuit (1);

an output terminal (62) of the first delay circuit (1) is connected to the gate of the twelfth (Q15) transistor and to an input terminal of the second delay circuit (2); and an output terminal (64) of the second delay circuit is connected to the gate of the thirteenth (Q16) transistor.

8. The circuitry of claim 7 further characterized in that all of the field effect transistors (Q1, Q2, Q3, Q4, Q5, Q6, Q7, Q8, Q9, and Q10) are enhancement mode n-channel.

9. Circuitry comprising:
a cross-coupled circuit (Q1, Q2) having first (12) and second (14) terminals;

first (Q3) and second (Q4) resistive-type devices which each have a first (12, 14) and a second (18, 22) output terminal, the first output terminals of the first (Q3) and second (Q4) devices are connected to the first (12) and second (14) terminals, respectively, of the cross-coupled circuit (Q1, Q2);

read/write circuits (Q7, Q8, Q9, Q10);

the read/write circuits (Q7, Q8, Q9, Q10) comprise separate first (Q7) and second (Q8) read circuits and separate first (Q9) and second (Q10) write circuits; and the first (Q7) and second (Q8) read circuits are connected to the first (12) and second (14) terminals of the cross-coupled circuit, respectively, and the first write circuit (Q9) is connected to the second terminal (18) of the first device (Q3), and the second write circuit (Q10) is connected to the second terminal (22) of the second device (Q4).

* * * * *